United States Patent
Keeth et al.

(10) Patent No.: US 6,256,234 B1
(45) Date of Patent: *Jul. 3, 2001

(54) LOW SKEW DIFFERENTIAL RECEIVER WITH DISABLE FEATURE

(75) Inventors: Brent Keeth, Boise; Russel J. Baker, Meridian, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/577,109

(22) Filed: May 23, 2000

Related U.S. Application Data (63) Continuation of application No. 09/140,857, filed on Aug. 27, 1998, now Pat. No. 6,104,209, which is a continuation-in-part of application No. 08/798,228, filed on Feb. 11, 1997, now Pat. No. 5,852,378, and a continuation-in-part of application No. 08/993,837, filed on Dec. 18, 1997, now Pat. No. 5,953,276.

(51) Int. Cl.$^7$ ..................................................... G11C 7/00
(52) U.S. Cl. .................... 365/189.05; 365/208; 365/233; 327/161; 327/171
(58) Field of Search .................... 365/208, 207, 365/233, 189.05; 326/83, 33, 58; 327/171, 161, 165

(56) References Cited

U.S. PATENT DOCUMENTS

| | | | |
|---|---|---|---|
| 4,459,660 | 7/1984 | Bellay et al. | 364/200 |
| 4,508,983 | 4/1985 | Allgood et al. | 307/577 |
| 4,689,494 | 8/1987 | Chen et al. | 307/202.1 |
| 4,714,839 | 12/1987 | Chung | 307/441 |
| 4,720,817 | 1/1988 | Childers | 365/200 |
| 4,801,992 | 1/1989 | Golubic | 357/40 |
| 4,843,188 | 6/1989 | Patterson et al. | 174/52.4 |
| 4,958,088 | 9/1990 | Farah-Bakhsh et al. | 307/443 |
| 5,075,569 | 12/1991 | Branson | 307/270 |
| 5,097,157 | 3/1992 | Jaffe et al. | 307/530 |
| 5,164,619 | 11/1992 | Luebs | 307/480 |
| 5,216,297 | 6/1993 | Proebsting | 307/475 |
| 5,239,206 | 8/1993 | Yanai | 307/272.2 |
| 5,248,946 | 9/1993 | Murakami et al. | 330/253 |
| 5,272,729 | 12/1993 | Bechade et al. | 375/118 |

(List continued on next page.)

FOREIGN PATENT DOCUMENTS

| | | |
|---|---|---|
| WO 95/22064 | 8/1995 | (WO) . |
| WO 95/32549 | 11/1995 | (WO) . |

OTHER PUBLICATIONS

Chapman, J. et al., "A Low–Cost High–Performance CMOS Timing Vernier for ATE", IEEE International Test Conference, Paper 21.2, 1995, pp. 459–468.

Descriptive literature entitled, "400MHz SLDRAM, 4M×16SLDRAM Pipelined, Eight Bank, 2.5 V Operation," SLDRAM Consortium Advance Sheet, published throughout the United States, pp. 1–22.E79 C., No. 7, Jul. 1996.

(List continued on next page.)

*Primary Examiner*—Son T. Dinh
(74) *Attorney, Agent, or Firm*—Dorsey & Whitney LLP (57) ABSTRACT

A differential clock receiver for a SynchLink-type Synchronous Dynamic Random Access Memory (SLDRAM) includes a differential amplifier with a novel method for biasing its NMOS and PMOS current sources. A differential clock received and amplified by the differential amplifier switches a set of multiplexers, which respond by outputting a differential output clock. The multiplexers can be "disabled" by an inactive enable signal so they output a constant "0" level for the differential output clock. This disabling feature of the differential clock receiver is particularly useful with the intermittent data clocks found in SLDRAMs. Also, the novel biasing method for the current sources of the differential amplifier gives the clock receiver very low skew.

34 Claims, 3 Drawing Sheets

U.S. PATENT DOCUMENTS

| | | | |
|---|---|---|---|
| 5,278,460 | 1/1994 | Casper | 307/296.5 |
| 5,295,102 | 3/1994 | McClure | 365/200 |
| 5,311,081 | 5/1994 | Donaldson et al. | 307/475 |
| 5,361,002 | 11/1994 | Casper | 327/530 |
| 5,389,834 | 2/1995 | Kinugasa et al. | 326/21 |
| 5,412,593 | 5/1995 | Magel et al. | 365/96 |
| 5,422,529 | 6/1995 | Lee | 327/536 |
| 5,430,408 | 7/1995 | Ovens et al. | 327/404 |
| 5,432,823 | 7/1995 | Gasbarro et al. | 375/356 |
| 5,442,589 | 8/1995 | Kowalski | 365/225.7 |
| 5,448,187 | 9/1995 | Kowalski | 326/81 |
| 5,451,898 | 9/1995 | Johnson | 327/563 |
| 5,455,798 | 10/1995 | McClure | 365/200 |
| 5,465,060 | 11/1995 | Pelella | 327/51 |
| 5,488,321 | 1/1996 | Johnson | 327/66 |
| 5,491,664 | 2/1996 | Phelan | 365/200 |
| 5,495,436 | 2/1996 | Callahan | 365/96 |
| 5,526,312 | 6/1996 | Eltoukhy | 365/201 |
| 5,528,539 | 6/1996 | Ong et al. | 365/200 |
| 5,539,333 | 7/1996 | Cao et al. | 326/93 |
| 5,563,546 | 10/1996 | Tsukada | 327/408 |
| 5,570,042 | 10/1996 | Ma | 326/63 |
| 5,572,458 | 11/1996 | Smith et al. | 365/96 |
| 5,572,476 | 11/1996 | Eltoukhy | 365/210 |
| 5,574,729 | 11/1996 | Kinoshita et al. | 371/10.3 |
| 5,577,050 | 11/1996 | Bair et al. | 321/10.2 |
| 5,578,941 | 11/1996 | Sher et al. | 326/34 |
| 5,602,786 | 2/1997 | Pascucci et al. | 365/200 |
| 5,617,365 | 4/1997 | Horiguchi et al. | 365/200 |
| 5,621,340 | 4/1997 | Lee et al. | 327/65 |
| 5,625,805 | 4/1997 | Fenwick et al. | 395/558 |
| 5,654,658 | 8/1997 | Kubota et al. | 327/211 |
| 5,659,509 | 8/1997 | Golla et al. | 365/200 |
| 5,663,915 | 9/1997 | Mobley | 365/208 |
| 5,666,067 | 9/1997 | Sher et al. | 326/34 |
| 5,668,492 | 9/1997 | Pedersen et al. | 327/295 |
| 5,691,945 | 11/1997 | Liou et al. | 365/200 |
| 5,706,292 | 1/1998 | Merritt | 371/10.2 |
| 5,734,617 | 3/1998 | Zheng | 365/225.7 |
| 5,736,882 | 4/1998 | Witte | 327/295 |
| 5,748,020 | 5/1998 | Mactaggart et al. | 327/52 |
| 5,757,705 | 5/1998 | Manning | 365/201 |
| 5,757,711 | 5/1998 | Nakaoka et al. | 365/207 |
| 5,781,486 | 7/1998 | Merritt | 365/201 |
| 5,790,462 | 8/1998 | McClure | 365/200 |
| 5,809,225 | 9/1998 | Ohsawa et al. | 395/183.08 |
| 5,850,150 | 12/1998 | Mitra et al. | 327/297 |
| 5,852,378 | 12/1998 | Keeth | 327/171 |
| 5,875,144 | 2/1999 | Zheng | 365/225.7 |
| 5,898,287 | 4/1999 | Roberti et al. | 318/605 |
| 5,898,297 | 4/1999 | Bosnyak et al. | 323/315 |
| 5,901,105 | 5/1999 | Ong et al. | 365/230.06 |
| 5,915,105 | 6/1999 | Farmwald et al. | 395/309 |
| 5,953,276 | 9/1999 | Baker | 365/208 |
| 5,978,298 | 11/1999 | Zheng | 365/225.7 |
| 6,011,742 | 1/2000 | Zheng | 365/225.7 |
| 6,069,510 | 5/2000 | Keeth | 327/170 |

OTHER PUBLICATIONS

"Draft Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

Satoru Tanoi, Member, IEEE, Tetsuya Tanabe, Kazuhiko Takahashi, Sanpei Miyamoto, and Masaru Uesugi, "A 250–622 MHz Deskew and Jitter–Suppressed Clock Buffer Using Two–Loop Architecture," IEICE Trans, Electron, vol.

LOW SKEW DIFFERENTIAL RECEIVER WITH DISABLE FEATURE

CROSS-REFERENCE TO RELATED APPLICATIONS

This patent application is a continuation-in-part of a related patent application entitled "Low Skew Differential Signal Converter," filed Feb. 11, 1997, and having Ser. No. 08/798,228, now U.S. Pat. No. 5,852,378 and is also a continuation-in-part of a related patent application entitled "Fully Differential Amplifier," filed Dec. 23, 1997, and having Ser. No. 08/993,837, now U.S. Pat. No. 5,953,276. Both of these related applications are hereby incorporated into this patent application by reference.

This application is a continuation of pending U.S. patent application No. 09/140,857, now U.S. Pat. No. 6,104,209 filed Aug. 27, 1998, which is a continuation-in-part of both U.S. patent application Ser. No. 08/798,228, filed Feb. 11, 1997, issued Dec. 22, 1998 as U.S. Pat. No. 5,852,378, and U.S. patent application Ser. No. 08/993,837, filed Dec. 18, 1997, issued Sep. 14, 1999, as U.S. Pat. No. 5,953,276.

BACKGROUND OF THE INVENTION

1. Technical Field

This invention relates in general to semiconductor devices and, more specifically, to receivers and other input buffers having differential inputs and outputs, low skew, and a disable feature. Such receivers are particularly useful in synchronous semiconductor memories.

2. Related Art

Most Dynamic Random Access Memories (DRAMs) have an asynchronous timing relationship with other electronic devices they interact with. In recent years, however, synchronous DRAMs have become popular because they provide faster memory access than asynchronous DRAMs.

Figure 1:
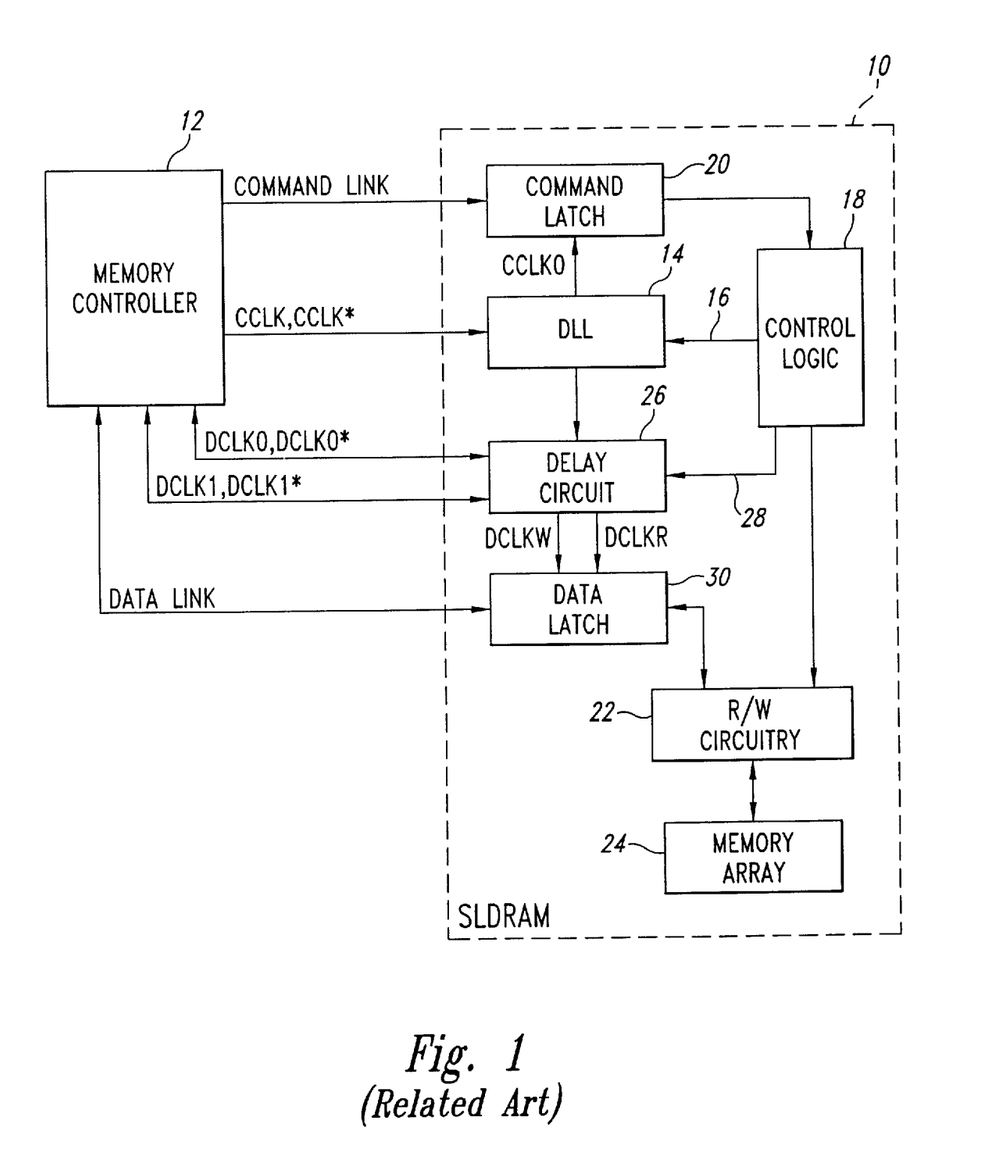
FIG. 1 is a block diagram of a "SynchLink" Dynamic Random Access Memory (SLDRAM) and memory controller in accordance with related (not prior) art.

One type of synchronous DRAM, known as a "SynchLink" DRAM (SLDRAM), is shown in FIG. 1. The non-prior art SLDRAM 10 receives command packets containing command and address signals from a memory controller 12 via a 10-bit-wide command link, and these command packets are latched into the SLDRAM 10 in response to a differential command clock (CCLK, CCLK*). Similarly, the SLDRAM 10 and memory controller 12 share write and read data via a bidirectional, 16-bit-wide datalink, and this data is latched into or out of the SLDRAM 10 in response to one of two differential data clocks (DCLK0, DCLK0*) and (CCLK1, DCLK1*). The particular data clock (DCLK0, DCLK0*) or (DCLK1, DCLK1*) in use at any given time is determined by command signals from the memory controller 12.

Within the SLDRAM 10, a delay locked-loop (DLL) 14 generates a delayed command clock CCLKD in response to the command clock (CCLK, CCLK*) and control signals 16 received from control logic 18. The delayed command clock CCLKD, in turn, causes a command latch 20 to latch in a command packet from the command link. The command packet is then made available to the control logic 18, which responds by directing read/write (R/W) circuitry 22 to access a memory array 24 of the SLDRAM 10.

Also, a delay-circuit 26 generates a delayed write data clock DCLKW and a delayed read data clock DCLKR in response to control signals 28 from the control logic 18 and the data clock (DCLK0, DCLK0*) or DCLK1, DCLK1*) selected by the memory controller 12. In a write operation, the delayed write data clock DCLKW causes a data latch 30 to latch in write data from the datalink, which is then made available to the R/W circuitry 22 for storage in the memory array 24. In a read operation, the delayed read data clock DCLKR causes the data latch 30 to latch in read data from the R/W circuitry 22 and memory array 24, which is then transferred over the datalink to the memory controller 12.

Figure 2:
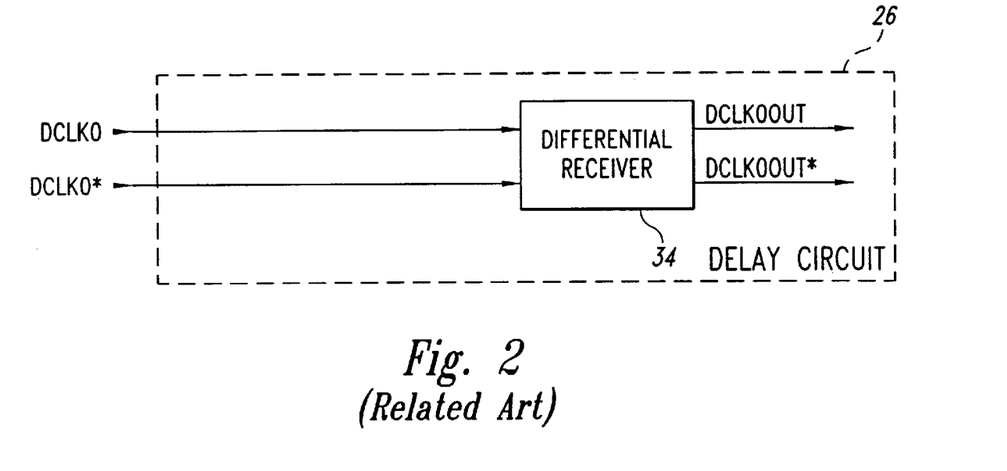
FIG. 2 is a more detailed view of a differential receiver in the SLDRAM of FIG. 1.

Each of the differential clocks (CCLK, CCLK*), (DCLK0, DCLK0*) and (DCLK1, DCLK1*) is typically buffered by a differential receiver within the SLDRAM 10. For example, as shown in FIG. 2, the delay circuit 26 generally includes a differential receiver 34 that buffers the differential data clock (DCLK0, DCLK0*) and outputs a corresponding differential data clock (DCLK0OUT, DCLK0OUT*) suitable for internal use by the SLDRAM 10 (FIG. 1).

Proper operation of the SLDRAM 10 (FIG. 1) generally requires that the differential receiver 34 exhibit low timing skew. Also, because the data clock (DCLK0, DCLK0*) is only operative intermittently (recall that the memory controller 12 (FIG. 1) periodically selects one or the other of the data clocks (DCLK0, DCLK0*) and (DCLK1, DCLK1*) for current use), it is desirable for the differential receiver 34 to have a disable feature which causes it to output a "0" state on its outputs DCLK0UT and DCLK0UT* when the other data clock (DCLK1, DCLK1*) (FIG. 1) is the operative data clock. Of course, the differential receiver 34 does not require a disable feature if it is used to buffer the command clock (CCLK, CCLK*) (FIG. 1) rather than the data clock (DCLK0, DCLK0*).

Various input buffers, receivers, and low skew circuit architectures are known in the art, including, for example, those described in U.S. Pat. Nos. 4,958,088, 5,164,619, 5,278,460, 5,311,081, 5,361,002, 5,432,823, 5,465,060, 5,539,333, 5,570,042, 5,578,941, 5,625,805, and 5,666,067. But none of these satisfy the requirements of a receiver for the SLDRAM described above.

Therefore, there is a need in the art for a receiver having differential inputs and outputs that exhibits low timing skew and, preferably, has a disable feature for use with intermittent data clocks. Such a receiver would be particularly useful with the SLDRAM described above and with other SDRAMs.

SUMMARY OF THE INVENTION

In one embodiment of this invention, an input buffer, such as a clock receiver, includes a differential amplifier. First and second inverter circuits in the differential amplifier have control nodes for receiving respective true and complementary input signals, such as a differential input clock signal, and have output nodes for outputting respective true and complementary amplified signals. Third and fourth inverter circuits of the differential amplifier have control nodes for receiving the respective true and complementary input signals, and have mutually coupled output nodes. A first current source has a supply node for receiving a supply voltage, a control node coupled to the output nodes of the third and fourth inverter circuits, and an output node coupled to supply nodes of the first, second, third, and fourth inverter circuits. Also, a second current source has a reference node for receiving a reference voltage, a control node coupled to the output nodes of the third and fourth inverter circuits, and an input node coupled to reference nodes of the first, second, third, and fourth inverter circuits. The input buffer also includes switching circuitry coupled to the differential amplifier for outputting true and complementary output signals in response to the true and complementary amplified signals.

The unique structure of the inventive input buffer gives it very low skew. Also, a disable feature may be provided in the switching circuitry to disable the output signals, which is convenient for use when buffering intermittent data clocks found in SynchLinktype Synchronous Dynamic Random Access Memories (SLDRAMs).

Other embodiments of this invention incorporate the input buffer described above into a DRAM, a Synchronous DRAM (SDRAM), an SLDRAM, a delay circuit, an electronic system, and a semiconductor substrate, such as a semiconductor wafer.

In still another embodiment of this invention, a differential input signal is buffered using a differential amplifier and switching circuitry, such as multiplexers. The differential amplifier includes first, second, third and fourth inverter circuits, a first current source having a control node coupled to output nodes of the third and fourth inverter circuits and an output node coupled to supply nodes of the first, second, third, and fourth inverter circuits, and a second current source having a control node coupled to the output nodes of the third and fourth inverter circuits and an input node coupled to reference nodes of the first, second, third, and fourth inverter circuits. To bias the differential amplifier, a supply voltage is applied to a supply node of the first current source, and a reference voltage is applied to a reference node of the second current source. Then, the differential input signal is applied to control nodes of the inverter circuits to generate a differential amplified signal at output nodes of the first and second inverter circuits. A differential output signal is then selectively output from the switching circuitry in response to the differential amplified signal.

DETAILED DESCRIPTION OF THE ILLUSTRATED EMBODIMENTS

Figure 3:
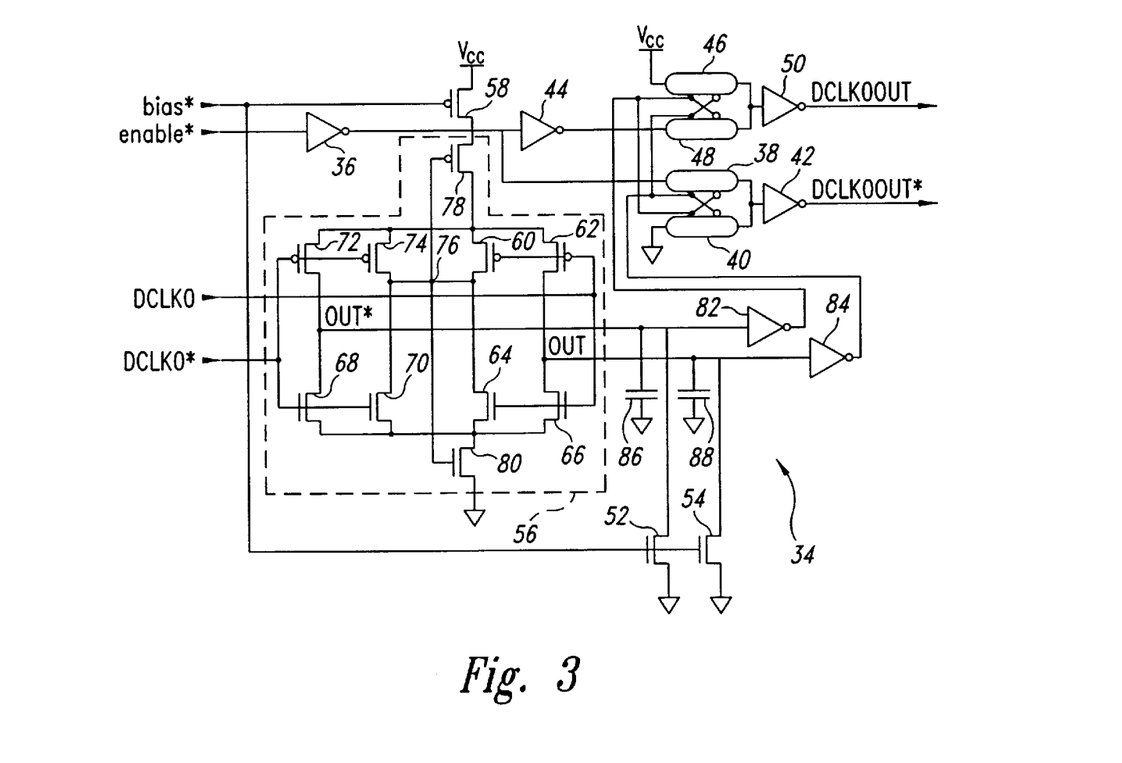
FIG. 3 is a circuit diagram of a differential receiver in accordance with this invention for use as shown in FIG. 2.

As shown in FIG. 3, in a start-up mode of the differential receiver 34, an inactive (i.e. high) enable signal ENABLE* causes an inverter 36 to output a low which, in turn, causes a pair of multiplexers or "muxes" 38 and 40 to output a low, thereby causing an inverter 42 to output an inactive (ie. high) data clock DCLK0OUT*. Also, the low output of the inverter 36 causes an inverter 44 to output a high which, in turn, causes a pair of muxes 46 and 48 to output a high, thereby causing an inverter 50 to output an inactive (i.e. low) data clock DCLK0OUT. At the same time, an inactive (i.e. high) bias signal BIAS* turns on a pair of NMOS transistors 52 and 54, thereby grounding true and complementary output nodes OUT and OUT* of a differential amplifier 56.

In a disabled mode, an active (i.e. low) bias signal BIAS* turns off the NMOS transistors 52 and 54 and turns on a PMOS current-source transistor 58, thereby supplying current to the differential amplifier 56. With a supply of current, the output nodes OUT and OUT* begin to follow the differential data clock (DCLK0, DCLK0*).

For example, during a preamble period of the disabled mode in which the differential data clock (DCLK0, DCLK0*) is in an inactive or "0" state, an inactive (i.e. low) data clock DCLK0 activates PMOS transistors 60 and 62 and deactivates NMOS transistors 64 and 66. At the same time, an inactive (ie. high) data clock DCLK0* activates NMOS transistors 68 and 70 while deactivating PMOS transistors 72 and 74. Concurrently, a self-correcting bias point 76 settles to a mid-point voltage level at which the current through a partially activated PMOS current-source transistor 78 matches the current through a partially activated NMOS transistor 80.

By the phrase "self-correcting," it is meant that any increase in voltage on the bias point 76 tends to turn the NMOS transistor 80 on more and the PMOS transistor 78 off more, which, in turn, tends to decrease the voltage on the bias point 76 by pulling it toward ground through the transistors 70 and 80. Similarly, any decrease in voltage on the bias point 76 tends to turn the PMOS transistor 78 on more and the NMOS transistor 80 off more, which, in turn, tends to increase the voltage on the bias point 76 by pulling it toward the supply voltage $V_{cc}$ through the transistors 60, 78, and 58. With the NMOS transistor 68 on, the complementary output node OUT* is pulled low, and with the PMOS transistor 62 on, the true output node OUT is pulled high.

The low output from the complementary output node OUT* causes an inverter 82 to output a high, and the high output by the true output node OUT causes an inverter 84 to output a low. However, in the disabled mode the inactive enable signal ENABLE* continues to cause the muxes 38, 40, 46, and 48 and the inverters 42 and 50 to output an inactive differential data clock (DCLK0OUT, DCLK0OUT*) no matter what the output nodes OUT and OUT* output.

In an enabled mode, an active (i.e. low) enable signal ENABLE* causes the inverter 36 to output a high, thereby providing a high voltage to the mux 38. Also, the high output from the inverter 36 causes the inverter 44 to output a low, thereby providing a low voltage to the mux 48.

The differential data clock (DCLK0, DCLK0*) then begins running as it is selected by the memory controller 12 (FIG. 1) for current use. When the differential data clock (DCLK0, DCLK0*) is in a "1" state, a high data clock DCLK0 turns off PMOS transistors 60 and 62 and turns on NMOS transistors 64 and 66, thereby pulling the true output node OUT low, while a low data clock DCLK0* turns on PMOS transistors 72 and 74 and turns off NMOS transistors 68 and 70, thereby pulling the complementary output node OUT* high.

The low output from the true output node OUT causes the inverter 84 to output a high, while the high output from the complementary output node OUT* causes the inverter 82 to output a low. These outputs then turn on the muxes 38 and 48 and turn off the muxes 40 and 46. As a result, the mux 38 passes a high to the inverter 42, which then outputs a low data clock DCLK0OUT*, and the mux 48 passes a low to the inverter 50, which then outputs a high data clock DCLK0OUT. It can be seen, of course, that a differential data clock (DCLK0, DCLK0*) in a "0" state would have the opposite effect and would cause the data clock DCLK0OUT to be low and the data clock DCLK0OUT* to be high. When it is time to switch from using the data clock (DCLK0, DCLK0*) (FIG. 1) to using the data clock (DCLK1, DCLK1*) (FIG. 1), then an inactive enable signal ENABLE* causes the receiver 34 to reenter the disabled mode and a similar receiver (not shown) can be enabled for use with the data clock (DCLK1, DCLK1*).

This invention thus provides a receiver having differential inputs and outputs and a disable feature useful with intermittent data clocks found in the SynchLink DRAM (SLDRAM). Also, the inventive receiver has very low skew because of its balanced differential amplifier design. Corrective capacitors 86 and 88 attached to the complementary and true output nodes OUT* and OUT of the differential amplifier 56 aid in balancing the NMOS and PMOS capacitances at the output nodes OUT and OUT*, thereby helping to minimize skew.

Those of skill in the technical field of this invention will understand that it is applicable to a wide variety of semiconductor devices, and is not restricted only to Synchronous DRAMs (SDRAMs), such as SLDRAMs. The principles of the invention may be applied, for example, in providing a wide variety of differential input buffers. Similarly, it should be understood that the invention does not typically need the disable feature when it is used with a command clock (CCLK, CCLK*) (see FIG. 1), but that the disable feature is of great use when the invention is used with an intermittent data clock.

Also, it should be understood that the transistor pairs 68 and 72, 70 and 74, 60 and 64, and 62 and 66 may be referred to as "inverter circuits," that the transistors 78 and 80 may be referred to as "current sources," and that the muxes 38, 40, 46, and 48 may be referred to as "switching circuitry."

Figure 4:
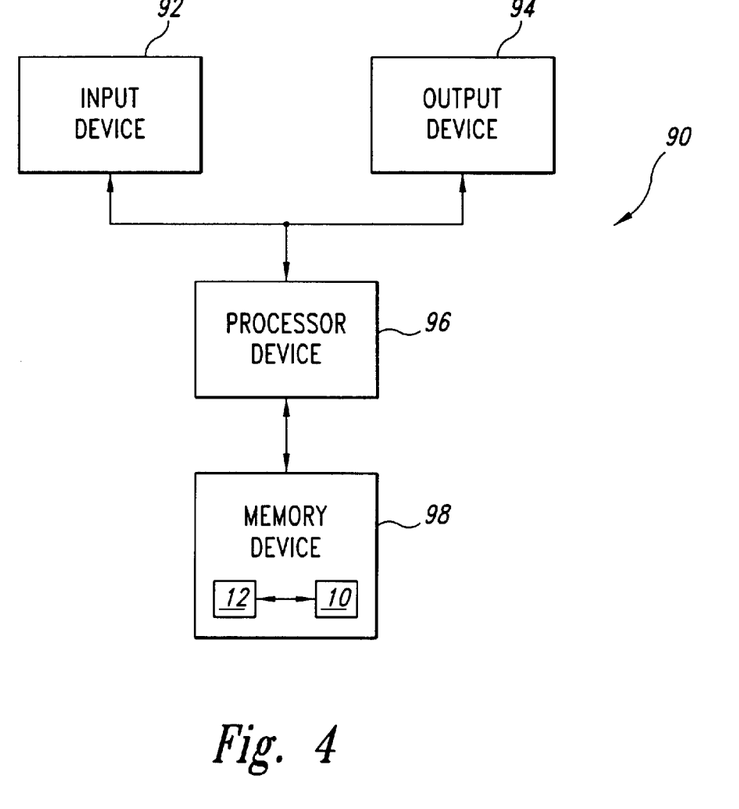
FIG. 4 is a block diagram of an electronic system incorporating the SLDRAM of FIG. 1, which includes the differential receiver of FIG. 3.

As shown in FIG. 4, an electronic system 90 includes an input device 92, an output device 94, a processor device 96, and a memory device 98 which includes the memory controller 12 and SLDRAM 10 of FIG. 1, incorporating the receiver 34 of FIG. 3. Of course, it will be understood that the memory controller 12 and SLDRAM 10 may be incorporated into any one of the input, output, and processor devices 92, 94, and 96 instead.

Figure 5:
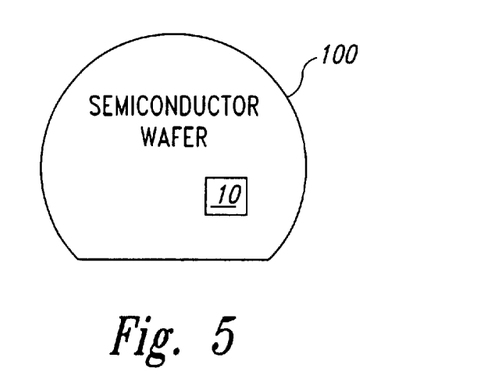
FIG. 5 is a diagram of a semiconductor wafer on which the SLDRAM of FIG. 1, including the differential receiver of FIG. 3, is fabricated.

As shown in FIG. 5, the SLDRAM 10 of FIG. 1, incorporating the receiver 34 of FIG. 3, is fabricated on the surface of a semiconductor wafer 100. It should be understood, though, that other substrates will work for purposes of this invention including, for example, Silicon-on-Sapphire (SOS) substrates, Silicon-on-Insulator (SOI) substrates, and Silicon-on-Glass (SOG) substrates.

Although the present invention has been described with reference to a particular embodiment, the invention is not limited to this embodiment. Rather, the invention is limited only by the appended claims, which include within their scope all equivalent devices and methods that operate according to the principles of the invention as described.

We claim:

1. An input buffer comprising:
    first and second inverter circuits each coupled between a supply node and a reference node, the first and second inverter circuits having respective control nodes coupled to receive respective true and complementary input clock signals and having output nodes for outputting respective true and complementary amplified signals;
    third and fourth inverter circuits each coupled between the supply node and the reference node, the third and fourth inverter circuits having control nodes coupled to receive the respective true and complementary input clock signals and having mutually coupled output nodes;
    a first current source having an input node coupled to a supply voltage, a control node coupled to the output nodes of the third and fourth inverter circuits, and an output node coupled to the supply node; and
    a second current source having an output node coupled to a reference voltage, a control node coupled to the output nodes of the third and fourth inverter circuits, and an input node coupled to the reference node.

2. The input buffer of claim 1 wherein each of the first, second, third, and fourth inverter circuits comprises:
    a PMOS transistor having a source coupled to the supply node, and a drain coupled to a respective one of the output nodes; and
    an NMOS transistor having a source coupled to the reference node, and a drain coupled to the drain of a respective PMOS transistor.

3. The input buffer of claim 1 wherein the first and second current sources comprise a PMOS transistor and an NMOS transistor, respectively, the PMOS transistor having a source coupled to the supply voltage, a gate coupled to the output nodes of the third and fourth inverter circuits, and a drain coupled the supply node, the NMOS transistor having a source coupled to the reference voltage, a gate coupled to the output nodes of the third and fourth inverter circuits, and a drain coupled to the reference node.

4. The input buffer of claim 1 wherein the reference voltage comprises ground potential.

5. A clock receiver for a semiconductor memory, the clock receiver comprising:
    first and second inverter circuits each coupled between a supply node and a reference node, the first and second inverter circuits having respective control nodes coupled to receive respective true and complementary input clock signals and having output nodes for outputting respective true and complementary amplified signals;
    third and fourth inverter circuits each coupled between the supply node and the reference node, the third and fourth inverter circuits having control nodes coupled to receive the respective true and complementary input clock signals and having mutually coupled output nodes;
    a first current source having an input node coupled to a supply voltage, a control node coupled to the output nodes of the third and fourth inverter circuits, and an output node coupled to the supply node; and
    a second current source having an output node coupled to a reference voltage, a control node coupled to the output nodes of the third and fourth inverter circuits, and an input node coupled to the reference node.

6. The clock receiver of claim 5 wherein each of the first, second, third, and fourth inverter circuits comprises:
    a PMOS transistor having a source coupled to the supply node, and a drain coupled to a respective one of the output nodes; and
    an NMOS transistor having a source coupled to the reference node, and a drain coupled to the drain of a respective PMOS transistor.

7. The clock receiver of claim 5 wherein the first and second current sources comprise a PMOS transistor and an NMOS transistor, respectively, the PMOS transistor having a source coupled to the supply voltage, a gate coupled to the output nodes of the third and fourth inverter circuits, and a drain coupled the supply node, the NMOS transistor having a source coupled to the reference voltage, a gate coupled to the output nodes of the third and fourth inverter circuits, and a drain coupled to the reference node.

8. The clock receiver of claim 5 wherein the reference voltage comprises ground potential.

9. A self-biasing inverter for generating an output signal responsive to an input signal, the inverter comprising:
   an inverter circuit coupled between a supply node and a reference node, the inverter circuit having a control node coupled to receive the input signal and having an output node for outputting the output signal;
   a current control circuit coupled between the supply node and the reference node, the current control circuit being operable to generate a control signal that is a function of the magnitude of a voltage on the supply node and the voltage on the reference node;
   a first current source having an input node coupled to a supply voltage, a control node coupled to receive the control signal, and an output node coupled to the supply node; and
   a second current source having an output node coupled to a reference voltage, a control node coupled to receive the control signal, and an input node coupled to the reference node.

10. The inverter of claim 9 wherein the current control circuit comprises a pair of inverter circuits each coupled between the supply node and the reference node, the pair of inverter circuits having respective control nodes coupled to receive the input signal and having respective, mutually coupled output nodes on which the control signal is generated.

11. The inverter of claim 10 wherein the first and second current sources comprise a PMOS transistor and an NMOS transistor, respectively, the PMOS transistor having a source coupled to the supply voltage, a gate coupled to the output nodes of the pair of inverter circuits, and a drain coupled the supply node, the NMOS transistor having a source coupled to the reference voltage, a gate coupled to the output nodes of the pair of inverter circuits, and a drain coupled to the reference node.

12. The inverter of claim 9 further comprising a second inverter circuit coupled between the supply node and the reference node, the second inverter circuit having a control node coupled to receive a second signal that is a compliment of the input signal and having an output node for outputting a signal that is a compliment of the output signal.

13. The inverter of claim 9 wherein the reference voltage comprises ground potential.

14. A Synchronous Dynamic Random Access Memory (SDRAM) comprising:
   a memory array;
   read/write circuitry coupled to the memory array;
   control logic coupled to the read/write circuitry;
   a data latch coupled to the read/write circuitry;
   a command latch coupled to the control logic; and
   a clock buffer comprising:
      first and second inverter circuits each coupled between a supply node and a reference node, the first and second inverter circuits having respective control nodes coupled to receive respective true and complementary input clock signals and having output nodes for outputting respective true and complementary amplified signals;
      third and fourth inverter circuits each coupled between the supply node and the reference node, the third and fourth inverter circuits having control nodes coupled to receive the respective true and complementary input clock signals and having mutually coupled output nodes;
      a first current source having an input node coupled to a supply voltage, a control node coupled to the output nodes of the third and fourth inverter circuits, and an output node coupled to the supply node; and
      a second current source having an output node coupled to a reference voltage, a control node coupled to the output nodes of the third and fourth inverter circuits, and an input node coupled to the reference node.

15. The SDRAM of claim 14 wherein each of the first, second, third, and fourth inverter circuits comprises:
   a PMOS transistor having a source coupled to the supply node, and a drain coupled to a respective one of the output nodes; and
   an NMOS transistor having a source coupled to the reference node, and a drain coupled to the drain of a respective PMOS transistor.

16. The SDRAM of claim 14 wherein the first and second current sources comprise a PMOS transistor and an NMOS transistor, respectively, the PMOS transistor having a source coupled to the supply voltage, a gate coupled to the output nodes of the third and fourth inverter circuits, and a drain coupled the supply node, the NMOS transistor having a source coupled to the reference voltage, a gate coupled to the output nodes of the third and fourth inverter circuits, and a drain coupled to the reference node.

17. The SDRAM of claim 14 wherein the reference voltage comprises ground potential.

18. The SDRAM of claims 14 wherein the SDRAM comprises a synchronous link dynamic random access memory.

19. A memory device comprising:
   a memory array;
   read/write circuitry coupled to the memory array;
   control logic coupled to the read/write circuitry;
   a data latch coupled to the read/write circuitry;
   a command latch coupled to the control logic; and
   an inverter comprising:
      an inverter circuit coupled between a supply node and a reference node, the inverter circuit having a control node coupled to receive the input signal and having an output node for outputting the output signal;
      a current control circuit coupled between the supply node and the reference node, the current control circuit being operable to generate a control signal that is a function of the magnitude of a voltage on the supply node and the voltage on the reference node;
      a first current source having an input node coupled to a supply voltage, a control node coupled to receive the control signal, and an output node coupled to the supply node; and
      a second current source having an output node coupled to a reference voltage, a control node coupled to receive the control signal, and an input node coupled to the reference node.

20. The memory device of claim 19 wherein the current control circuit comprises a pair of inverter circuits each coupled between the supply node and the reference node, the pair of inverter circuits having respective control nodes coupled to receive the input signal and having respective, mutually coupled output nodes on which the control signal is generated.

21. The memory device of claim 20 wherein the first and second current sources comprise a PMOS transistor and an NMOS transistor, respectively, the PMOS transistor having a source coupled to the supply voltage, a gate coupled to the output nodes of the pair of inverter circuits, and a drain coupled the supply node, the NMOS transistor having a source coupled to the reference voltage, a gate coupled to the output nodes of the pair of inverter circuits, and a drain coupled to the reference node.

22. The memory device of claim 19 further comprising a second inverter circuit coupled between the supply node and the reference node, the second inverter circuit having a control node coupled to receive a second signal that is a compliment of the input signal and having an output node for outputting a signal that is a compliment of the output signal.

23. The memory device of claim 19 wherein the reference voltage comprises ground potential.

24. A computer system, comprising:
a processor having a processor bus;
an input device coupled to the processor through the processor bus and adapted to allow data to be entered into the computer system;
an output device coupled to the processor through the processor bus adapted to allow data to be output from the computer system;
a memory controller coupled to the processor through the processor bus; and
a Synchronous Dynamic Random Access Memory (SDRAM), comprising:
a memory array;
read/write circuitry coupled to the memory array;
control logic coupled to the read/write circuitry;
a data latch coupled to the read/write circuitry;
a command latch coupled to the control logic; and
a clock buffer comprising:
first and second inverter circuits each coupled between a supply node and a reference node, the first and second inverter circuits having respective control nodes coupled to receive respective true and complementary input clock signals and having output nodes for outputting respective true and complementary amplified signals;
third and fourth inverter circuits each coupled between the supply node and the reference node, the third and fourth inverter circuits having control nodes coupled to receive the respective true and complementary input clock signals and having mutually coupled output nodes;
a first current source having an input node coupled to a supply voltage, a control node coupled to the output nodes of the third and fourth inverter circuits, and an output node coupled to the supply node; and
a second current source having an output node coupled to a reference voltage, a control node coupled to the output nodes of the third and fourth inverter circuits, and an input node coupled to the reference node.

25. The computer system of claim 24 wherein each of the first, second, third, and fourth inverter circuits comprises:
a PMOS transistor having a source coupled to the supply node, and a drain coupled to a respective one of the output nodes; and
an NMOS transistor having a source coupled to the reference node, and a drain coupled to the drain of a respective PMOS transistor.

26. The computer system of claim 24 wherein the first and second current sources comprise a PMOS transistor and an NMOS transistor, respectively, the PMOS transistor having a source coupled to the supply voltage, a gate coupled to the output nodes of the third and fourth inverter circuits, and a drain coupled the supply node, the NMOS transistor having a source coupled to the reference voltage, a gate coupled to the output nodes of the third and fourth inverter circuits, and a drain coupled to the reference node.

27. The computer system of claim 24 wherein the reference voltage comprises ground potential.

28. A computer system, comprising:
a processor having a processor bus;
an input device coupled to the processor through the processor bus and adapted to allow data to be entered into the computer system;
an output device coupled to the processor through the processor bus adapted to allow data to be output from the computer system;
a memory controller coupled to the processor through the processor bus; and
a memory device coupled to the processor through the processor bus, comprising:
a memory array;
read/write circuitry coupled to the memory array;
control logic coupled to the read/write circuitry;
a data latch coupled to the read/write circuitry;
a command latch coupled to the control logic; and
an inverter comprising:
an inverter circuit coupled between a supply node and a reference node, the inverter circuit having a control node coupled to receive the input signal and having an output node for outputting the output signal;
a current control circuit coupled between the supply node and the reference node, the current control circuit being operable to generate a control signal that is a function of the magnitude of a voltage on the supply node and the voltage on the reference node;
a first current source having an input node coupled to a supply voltage, a control node coupled to receive the control signal, and an output node coupled to the supply node; and
a second current source having an output node coupled to a reference voltage, a control node coupled to receive the control signal, and an input node coupled to the reference node.

29. The computer system of claim 28 wherein the current control circuit comprises a pair of inverter circuits each coupled between the supply node and the reference node, the pair of inverter circuits having respective control nodes coupled to receive the input signal and having respective, mutually coupled output nodes on which the control signal is generated.

30. The computer system of claim 28 wherein the first and second current sources comprise a PMOS transistor and an NMOS transistor, respectively, the PMOS transistor having a source coupled to the supply voltage, a gate coupled to the output nodes of the pair of inverter circuits, and a drain coupled the supply node, the NMOS transistor having a source coupled to the reference voltage, a gate coupled to the output nodes of the pair of inverter circuits and a drain coupled to the reference node.

31. The computer system of claim 28 further comprising a second inverter circuit coupled between the supply node and the reference node, the second inverter circuit having a control node coupled to receive a second signal that is a compliment of the input signal and having an output node for outputting a signal that is a compliment of the output signal.

32. The computer system of claim 28 wherein the reference voltage comprises ground potential.

33. A method of generating an output signal at an output node responsive to an input signal, the method comprising:

coupling the output node to either of first or second reference nodes responsive to respective first or second logic levels of the input signal;

supplying current to the first reference node;

removing current from the second reference node; and adjusting the current supplied to the first reference node and the current removed from the second reference node responsive to the magnitude of the voltages on the first and second reference nodes.

34. The method of claim 33 wherein the act of adjusting the current supplied to the first reference node and the current removed from the second reference node responsive to the magnitude of the voltages on the first and second reference nodes comprises:

deriving a control voltage that increases with an increase in the voltage on the first reference node and increases with an increase in the voltage on the second reference node, and decreases with a decrease in the voltage on the first reference node and decreases with a decrease in the voltage on the second reference node;

increasing the current supplied to the first reference node responsive to a decrease in the control voltage and decreasing the current supplied to the first reference node responsive to an increase in the control voltage; and increasing the current removed from the second reference node responsive to an increase in the control voltage and decreasing the current removed from the first reference node responsive to a decrease in the control voltage.

* * * * *

UNITED STATES PATENT AND TRADEMARK OFFICE
CERTIFICATE OF CORRECTION

PATENT NO. : 6,256,234 B1
DATED : July 3, 2001
INVENTOR(S) : Brent Keeth and Russel J. Baker It is certified that error appears in the above-identified patent and that said Letters Patent is hereby corrected as shown below:

<u>Title page,</u>
Item [56], OTHER PUBLICATIONS, please remove "E79 C., No. 7, Jul. 1996."
Item [56], OTHER PUBLICATIONS, please add "E79 C., No. 7, Jul. 1996 after "vol."

<u>Column 8,</u>
Line 28, "claims" should read -- claim --

Signed and Sealed this

Eleventh Day of June, 2002

Attest:

JAMES E. ROGAN
Attesting Officer    Director of the United States Patent and Trademark Office